United States Patent
Lee et al.

[11] Patent Number: 5,956,609
[45] Date of Patent: Sep. 21, 1999

[54] METHOD FOR REDUCING STRESS AND IMPROVING STEP-COVERAGE OF TUNGSTEN INTERCONNECTS AND PLUGS

[75] Inventors: Jiun-Chung Lee, Taoyuan; Hui-Ling Wang, Taipei, both of Taiwan; Jowei Dun, San Jose, Calif.; Ken-Shen Chou, Hsin-Chu, Taiwan

[73] Assignee: Taiwan Semiconductor Manufacturing Company, Ltd., Hsin-Chu, Taiwan

[21] Appl. No.: 08/907,985

[22] Filed: Aug. 11, 1997

[51] Int. Cl.[6] .................................................. H01L 21/443
[52] U.S. Cl. ...................... 438/627; 438/629; 438/680; 438/648
[58] Field of Search .................................. 438/627, 648, 438/653, 656, 680, 629, 935

[56] References Cited

U.S. PATENT DOCUMENTS

| | | |
|---|---|---|
| 5,028,565 | 7/1991 | Chang et al. .......................... 437/192 |
| 5,407,698 | 4/1995 | Emesh . |
| 5,462,890 | 10/1995 | Hwang et al. .......................... 437/187 |
| 5,489,552 | 2/1996 | Merchant et al. . |
| 5,679,405 | 10/1997 | Thomas et al. . |
| 5,835,334 | 11/1998 | McMillin et al. . |

OTHER PUBLICATIONS

S. Wolf, "Silicon Processing For The VLSI ERA—vol. 2" Lattice Press, Sunset Beach, CA. 1990, p. 202.

*Primary Examiner*—Caridad Everhart
*Attorney, Agent, or Firm*—George O. Saile; Stephen B. Ackerman

[57] ABSTRACT

A method is described for improving the step coverage of tungsten interconnects and plugs when deposited at low temperatures into contact/via openings having high aspect ratios. The depositions are made at pressures between 4.5 and 100 Torr in a CVD tool. The method includes a first nucleation step, and a second step for filling the contact/via openings wherein deposition conditions favor good step coverage. For forming an interconnect and a third deposition step, providing moderate step coverage and low stress, is used to build up the interconnect. The high pressures permit deposition at practical rates at low temperatures. In addition the high pressures also permit application of backside gas pressure to the wafer during deposition, thereby improving the thermal contact between the wafer and the heated substrate holder. This contributes significantly to stress reduction and improved step coverage.

14 Claims, 7 Drawing Sheets

METHOD FOR REDUCING STRESS AND IMPROVING STEP-COVERAGE OF TUNGSTEN INTERCONNECTS AND PLUGS

BACKGROUND OF THE INVENTION (1) Field of the Invention

The invention relates to processes for the manufacture of semiconductor devices and more particularly to processes for forming tungsten layers for conductive interconnects.

(2) Description of Prior Art

The use of tungsten in the fabricating of very-large-scale-integrated(VLSI) circuits has been practiced since the mid 1980s. As a conductive material tungsten does not rank as high as aluminum, which has been the primary conductor used in micro-circuit chip technology for nearly forty years. On the other hand, tungsten provides many features which make it an important material for fabricating metal-to-silicon contacts, via plugs, and for intra level interconnects. In this capacity tungsten is deposited into contact or via openings, and anisotropically etched to the insulating layer, leaving tungsten in the openings. Where local interconnects are desired the deposited tungsten layer is patterned with photoresist and anisotropically etched, leaving interconnecting stripes over the insulator.

Chemical-vapor-deposited(CVD) tungsten has proven to be an excellent material for such interconnect applications because of its low resistance, low stress(less than $5 \times 10^9$ dynes/cm$^2$), and a coefficient of thermal expansion which closely matches that of silicon. In addition tungsten has a high resistance to electromigration which is a common problem with aluminum its alloys. CVD tungsten can be deposited at temperatures around 400° C. with good conformity and step coverage.

Although tungsten does not bond well to either silicon or to the adjacent silica based insulating layer, a thin layer(less than 1,000 Angstroms) of titanium(Ti) is often used as a bonding agent to the silicon. This is covered by a layer of titanium nitride(TiN) which acts as a diffusion barrier as well as a bonding layer to the tungsten. The Ti layer, when thermally annealed, fuses with silicon to form titanium silicide(TiSi$_2$) and with the silica based insulating layer to form a titanium silicate(Ti$_x$SiO$_y$). Adhesion of the TiN to the Ti and subsequently to the tungsten is considered excellent.

The good conformity and step coverage afforded by tungsten is due in large part to the nature of the deposition process itself. In the CVD process, particularly with low-pressure-chemical-vapor-deposition(LPCVD), the chemical reaction which forms the product occurs at the heated surface of the material receiving the deposition. At higher pressures, reaction tends to occur in the gas phase with an accompanying loss of step coverage.

Step coverage is a measure of how well a deposited layer maintains its nominal thickness as it crosses a step. FIG. 1 (adapted from Wolf, S., "Silicon Processing for the VLSI Era", Vol.2, Lattice Press, Sunset Beach, Calif., (1990), p.202, illustrates this measure. A layer of material 14 of nominal thickness $t_n$ is deposited onto a substrate material 10 having a step 16 typically formed in a deposited layer 12. The step coverage is defined by the minimum thickness of the film $t_s$ divided by its nominal thickness $t_n$ expressed in percent.

Step coverage becomes an important consideration in sub-micron integrated circuit technology where openings having high aspect ratios are frequently encountered, particularly in the formation of device level contacts. The aspect ratio is defined as the ratio of the depth of the opening to its width. Contact openings having aspect ratios of 3 or greater are becoming commonplace as device dimensions continue to shrink.

The early CVD deposition processes for tungsten required temperatures above 500° C. in order to achieve acceptable layers with good edge coverage and resistivity. Sub-micron, integrated circuit elements are prone to damaging profile distortions when subjected to such temperatures and therefore have a restricted thermal budget.

One of the problems associated with the CVD deposition of tungsten involves the granular structure of the deposited material. Although low pressure techniques produce films having good edge coverage, the large grain structure results if films with poor specular reflectivity, a higher degree of stress, and a higher resistivity. The specular reflectivity is an indication of the granular structure of the film.

Chang, et. al., U.S. Pat. No. 5,028,565 cites that tungsten layers having good adhesion, a high specular reflectivity as well as a high deposition rate can be deposited at a temperatures between 350° C. and 525° C. using high pressures and a two step procedure. A nucleation layer of about 500 Angstroms is first deposited using the SiH$_4$, reduction of WF$_6$ at 450° C. and a pressure of 80 Torr. The main tungsten layer is then formed using the hydrogen reduction of WF$_6$. Raising the deposition temperature to 475° C. resulted in a lowering of stress. The presence of nitrogen in the carrier gas had a beneficial effect on the reflectivity.

Emesh U.S. Pat. No. 5,407,698 confirms the observations of Chang but states the method is not practical because many known CVD reactors are incapable of operating at such high pressures. Emesh, operating at lower pressures, introduces a third step in the formation of a tungsten layer. Nucleation is performed by the hydrogen reduction of WF$_6$ at 100 mTorr and 480° C. where good adhesion is obtained. The carrier gas is entirely of nitrogen. An intermediate step, using a low H$_2$/WF$_6$ ratio, is introduced to fill contact or via openings. Here, at a pressure of 9 Torr, good step coverage is obtained at the expense of increased grain size and high stress. Finally, in a third step, using a high H$_2$/WF$_6$ ratio, good step coverage is sacrificed in order to obtain small grain size, high specular reflectivity, low resistivity, and low stress.

Huang, et.al., U.S. Pat. No. 5,462,890 forms a tungsten plug in a contact or via opening by a two-step deposition process without the use of an adhesion layer such as TiN. The initial tungsten deposition takes place by introducing a reactive gas containing tungsten into a hydrogen radical plasma wherein good adhesion is obtained. The thicker tungsten blanket is then deposited in-situ by means of CVD.

SUMMARY OF THE INVENTION

Accordingly, it is an object of this invention to provide a method for forming, a tungsten interconnect at temperatures below 475° C. having improved step coverage when applied into high aspect ratio openings.

It is another object of this invention to provide a method for forming, a tungsten interconnect at temperatures below 475° C. having a high deposition rate.

It is yet another object of this invention to provide a method for forming, a tungsten interconnect at temperatures below 475° C. having low values of stress.

It is still another object of this invention to provide a method for reducing stress in CVD deposited layers.

It is yet another object of this invention to provide a method for improving step coverage and reducing stress during the deposition of a tungsten nucleation layer.

These objects are accomplished by depositing the tungsten interconnect in a three step sequence, forming firstly, a nucleation layer under conditions which provide good adhesion and reduced substrate damage; secondly, a filling layer under conditions which provide good edge coverage; and thirdly, an interconnect layer under conditions which provide small grain, highly reflective, low stress and low resistivity tungsten films. These steps are performed at pressures whereby additional stress reduction and step coverage improvement are realized by the application of gas pressure to the underside of the silicon wafer substrate, thereby improving thermal contact with the heated substrate holder. The improved thermal contact has the effect of reducing the cooling of the wafer by flowing gases, thereby maintaining a constant and controllable temperature of the wafer during the deposition period.

It is another object of this invention to provide a method for forming, a tungsten plug contact at temperatures below 475° C. having improved step coverage and low stress when applied into high aspect ratio openings.

It is yet another object of this invention to provide a method for forming, a tungsten plug contact at temperatures below 475° C. having a high deposition rate.

These objects are accomplished by depositing the tungsten plug contact in a two step sequence, forming firstly, a nucleation layer under conditions which provide good adhesion and reduced substrate damage and secondly, a filling layer under conditions which provide good edge coverage. These steps are performed at pressures whereby additional stress reduction and step coverage improvement are realized by the application of gas pressure to the underside of the silicon wafer substrate, thereby improving thermal contact with the heated substrate holder. The improved thermal contact has the effect of reducing the cooling of the wafer by flowing gases, thereby maintaining a constant and controllable temperature of the wafer during the deposition period.

DESCRIPTION OF THE PREFERRED EMBODIMENTS

Figure 1:
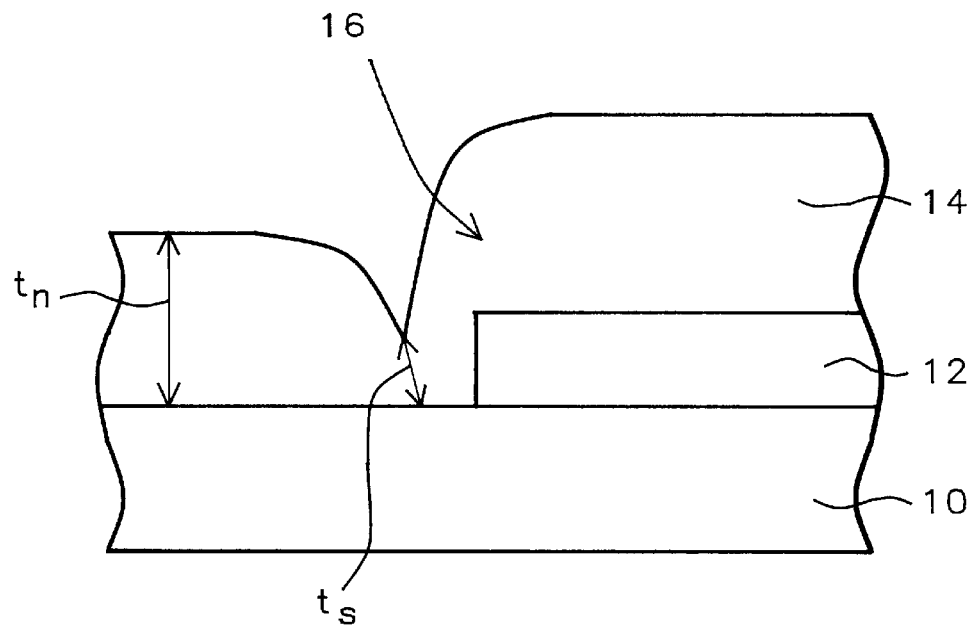
FIG. 1 is a cross section of a layer deposited over a step on a substrate illustrating the definition of step coverage.
Figure 2A:
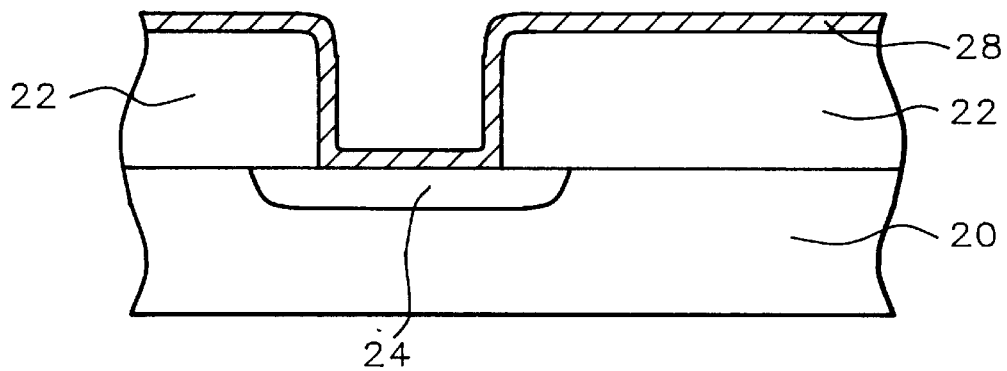
FIG. 2A through FIG. 2E are a cross sections of a portion of an integrated circuit water illustrating the process steps of an embodiment of the current invention for the formation of a tungsten interconnect involving contacts to semiconductor active areas.

In a first embodiment of this invention the formation of a tungsten interconnect is accomplished at the device level of an integrated circuit. The reader is referred to the cross section shown in FIG. 2A. A p-doped <100> oriented monocrystalline silicon wafer 20 is provided. Using standard processing techniques familiar to those in the integrated circuit manufacturing industry, semiconductor devices such as self-aligned polysilicon gate field-effect-transistors, are formed within the surface of the silicon wafer 20. A heavily doped implant 24 comprises an active area of such a device to which and interconnect is to be formed.

At the point of insertion of this invention a insulating layer of borophosphosilicate glass(BPSG) 22 between 1.0 and 1.5 microns thick has been deposited over the wafer surface. Typically, the BPSG layer 22 is planarized, either by thermal flowing of the glass or by other well known methods such as chemical mechanical polishing (CMP) or by the use of a spin-on-glass(SOG). and a contact opening 26 has been patterned and etched into it using reactive-ion-etching(RIE). The opening 26 is about 0.5 microns in cross section and has an aspect ratio of about 3. The photoresist mask used to pattern the contact opening 26 is next removed by oxygen plasma ashing and the wafer 20 is given a dip etch in diluted hydrofluoric acid(HF) to remove any native silicon oxide film from the silicon surface exposed by the opening 26.

A thin layer 28 comprising Ti followed by TiN is next deposited over the wafer 20 by well known methods, typically by sputtering. This layer 28 comprises the adhesion layer to which the subsequently deposited tungsten interconnect will bond. The detailed functions of this adhesion layer 28 are well known and have been discussed hereinbefore.

The wafer 20 is next placed into the chamber of a CVD reactor wherein the deposition of the tungsten interconnect layer is to be accomplishes in three successive CVD steps. A preferred CVD reactor which is employed in the process of this invention is the Centura WXZ system manufactured by Applied Materials Inc. of Santa Clara, Calif. The chamber is evacuated and the wafer 20 is brought to a temperature of 440° C. or thereabout. The Centura CVD reactor has a wafer support assembly which may be heated during CVD deposition. In addition the wafer support platform is provided with a channel which terminates in an arrangement of grooves on the surface, whereby by a pressure of an inert gas(typically helium which has a high thermally conductivity) may be applied to the underside of the wafer 20. It was found that the application of a backside pressure of 10 mTorr greatly improved the thermal contact between the wafer 20 and the wafer support.

Figure 2B:
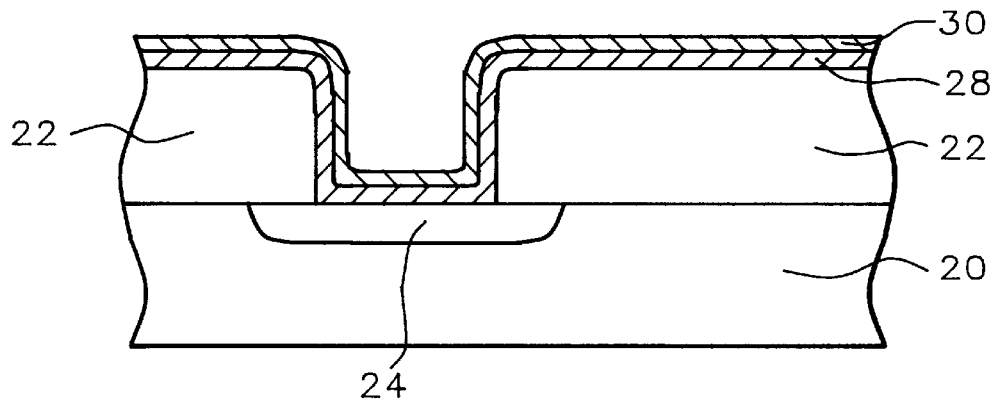

Referring now to FIG. 2B, a tungsten nucleation layer 30 is deposited by admitting a first gas composition comprising 10 SCCM or thereabout of $SiH_4$, 20 SCCM or thereabout of $WF_6$, 300 SCCM or thereabout of $N_2$, and 2,200 SCCM or thereabout of Ar. The preferred ratio of $WF_6$ to $SiH_4$ in the gas mixture is about 2.

The nucleation layer 30, about 600 Angstroms thick, may be formed in 44 seconds if a chamber pressure in the reactor of about 4.5 Torr is used. However, at this pressure and below, insufficient backside pressure can be applied in the current apparatus to provide good thermal contact between the heated substrate holder and the wafer 20. Instead a preferred chamber pressure of about 30 Torr is employed for the deposition of nucleation layer 30 in this embodiment. A backside pressure of about 10 Torr is then applied to the underside of the wafer 20. This keeps the temperature of the wafer 20 constant during the deposition. The deposition time is about 30 seconds. The application of backside pressure during the deposition of the nucleation layer has the effect of reducing the stress of a final 3,500 Angstrom thick tungsten layer from about $8.5 \times 10^9$ dynes/cm$^2$ to about $6.5 \times 10^9$ dynes/cm$^2$ while achieving an edge coverage of about 40%.

Figure 2C:
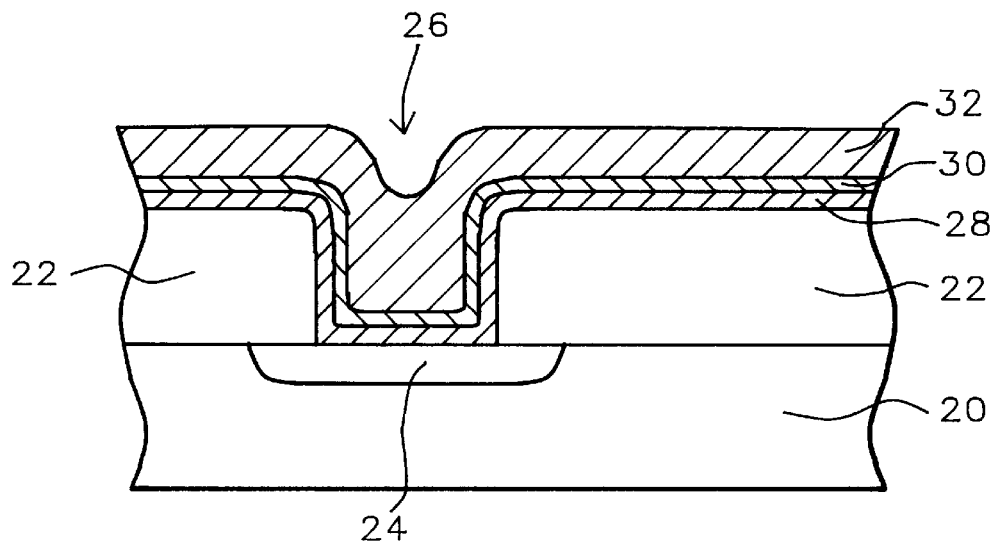

After the nucleation layer 30 is formed, the pressure within the CVD reactor is increased to between about 60 and 100 Torr, preferably about 90 Torr. The gas mixture is altered to provide a second composition comprising 700 SCCM or thereabout of $H_2$, 95 SCCM or thereabout of $WF_6$, 300 SCCM or thereabout of $N_2$, and 1,500 SCCM or thereabout of Ar. The wafer 20 is maintained at a temperature of between about 375° C. and 475° C. and preferably at about 440° C. A backside pressure of 25 Torr or thereabout is applied to maintain good temperature control and stability. Referring to FIG. 2C, a second layer of tungsten 32 is deposited with this gas composition to a thickness of about 1,200 Angstroms. The deposited thickness is dependent upon the step coverage requirement of the opening 26.

Figure 2D:
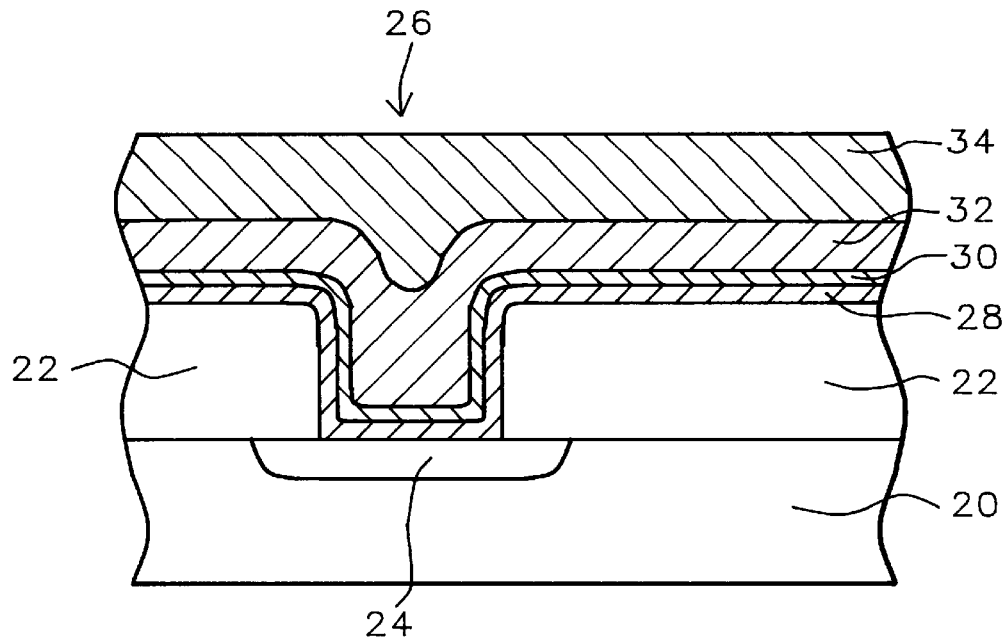

The tungsten interconnect is next completed by changing the gas mixture to a third composition comprising about 1,800 SCCM or thereabout of $H_2$, 25 SCCM or thereabout of $WF_6$, 40 SCCM or thereabout of $N_2$, and 2,200 SCCM or thereabout of Ar. The temperature of wafer 20 is maintained between about 375° C. and 475° C. and preferably at about 440° C. A backside pressure of about 30 Torr or thereabout is applied to maintain good temperature control and stability. Referring to FIG. 2D, a third layer of tungsten 34 is deposited with this gas composition and at a pressure of about 70 Torr, to a thickness of about 2,000 Angstroms. This requires about 80 seconds of deposition time. The layer 34 forms the bulk of the subsequently patterned interconnect strip e a nd has a low resistivity, low stress, and a high specular reflectivity.

Figure 2E:
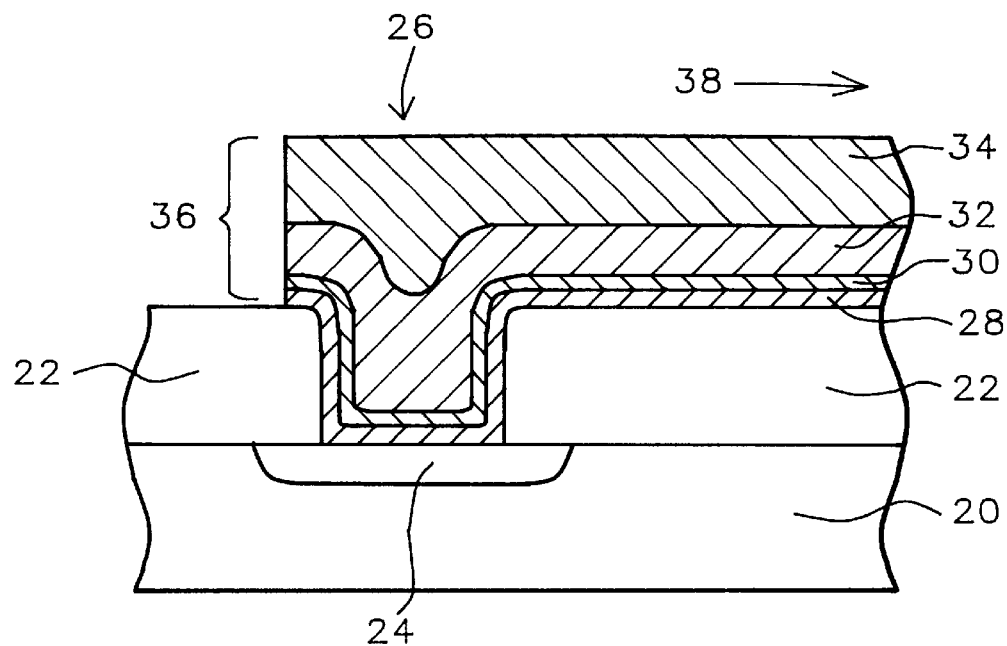

The wafer 20 is removed from the CVD reactor and a photoresist pattern is formed over it using well known photolithographic procedures. The pattern defines an interconnect stripe 26 over the insulating layer 22. Referring to FIG. 2E, the composite conductive layer 36, comprising the tungsten layers 30, 32, 34 and the subjacent adhesion layer 28, is etched, preferably using RIE with a gas mixture containing $SF_6$, forming the interconnect stripe 26. The arrow 38 on the right hand side of FIG. 2E indicates that the interconnect stripe 26 proceeds to regions elsewhere on the wafer 20 where additional connections are made.

Figure 3A:
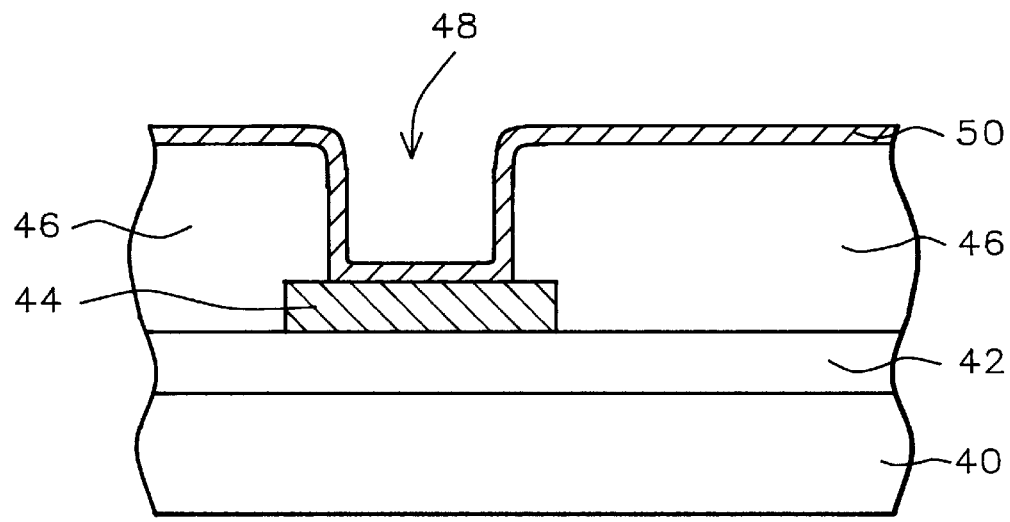
FIG. 3A through FIG. 3E are a cross sections of a portion of an integrated circuit wafer illustrating the process steps of an embodiment of the current invention for the formation of a tungsten interconnect to a subjacent conductive layer.

In a second embodiment of this invention the formation of a tungsten interconnect is accomplished at an intermediate level of integrated circuit wiring by formation a tungsten interconnect to a subjacent conductive layer. Referring to the cross section shown in FIG. 3A. A p-doped <100> oriented monocrystalline silicon wafer 40 is provided. Using standard processing techniques familiar to those in the integrated circuit manufacturing industry, semiconductor devices such as self-aligned polysilicon gate field-effect-transistors(not shown), are formed within the surface of the silicon wafer 40. Contacts to the elements of the semiconductive devices are formed and one or more interconnecting wiring levels represented by the layer 42 are formed according to the design of the integrated circuit.

At the point of insertion of this invention a metal pattern has been patterned over and is connected to the subjacent wiring levels 42. A portion of that pattern 44 is to be contacted by a tungsten interconnect formed according to the process of this invention. An insulating layer of borophosphosilicate glass(BPSG) 46 between 1.0 and 1.5 microns thick has been deposited over the metal pattern 44. Typically, the BPSG layer 46 is planarized, either by thermal flowing of the glass or by other well known methods such as chemical mechanical polishing (CMP) or by the use of a spin-on-glass(SOG). A via opening 48, about 0.5 microns in cross section with an aspect ratio of about 3, has been patterned and etched into the BPSG layer 46 by RIE using etchants and parametric conditions well known by those skilled in the art.

A thin layer 50 comprising Ti followed by TiN is deposited over the wafer 40 by well known methods, typically by sputtering. This layer 50 comprises the adhesion layer to which the subsequently deposited tungsten interconnect will bond. The detailed functions of this adhesion layer 50 are well known and have been discussed hereinbefore.

Figure 3B:
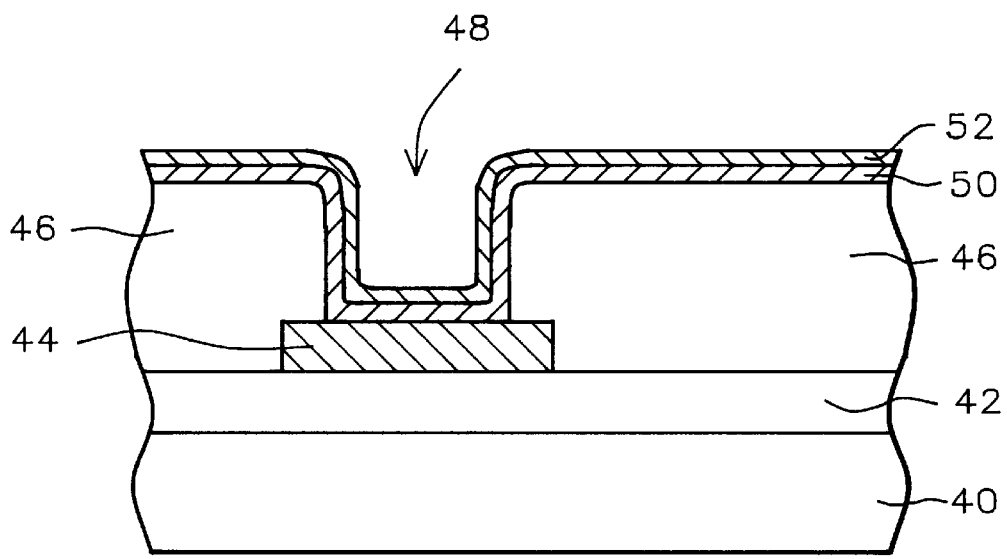

The wafer 40 is next placed into the chamber of a CVD reactor wherein the deposition of the tungsten interconnect layer is to be formed in three successive CVD steps. The chamber is evacuated and the wafer 40 is brought to a temperature of 440° C. or thereabout. Referring now to FIG. 3B, a tungsten nucleation layer 52 is deposited by admitting a first gas composition comprising 10 SCCM or thereabout of $SiH_4$, 20 SCCM or thereabout of $WF_6$, 300 SCCM or thereabout of $N_2$, and 2,200 SCCM or thereabout of Ar. The total pressure in the reactor is adjusted to 30 Torr or thereabout.

A backside pressure of 10 Torr or thereabout is applied to the underside of the wafer 40. This keeps the temperature of the wafer 40 constant during the deposition. The deposition time is about 30 seconds. The application of backside pressure during the deposition of the nucleation layer has the effect of reducing the stress of a final 3,500 Angstrom thick tungsten layer from about $8.5 \times 10^9$ dynes/cm$^2$ to about $6.5 \times 10^9$ dynes/cm$^2$. These conditions are maintained for a period of about 30 seconds during which the nucleation layer 52 is formed to a thickness of about 600 Angstroms.

Figure 3C:
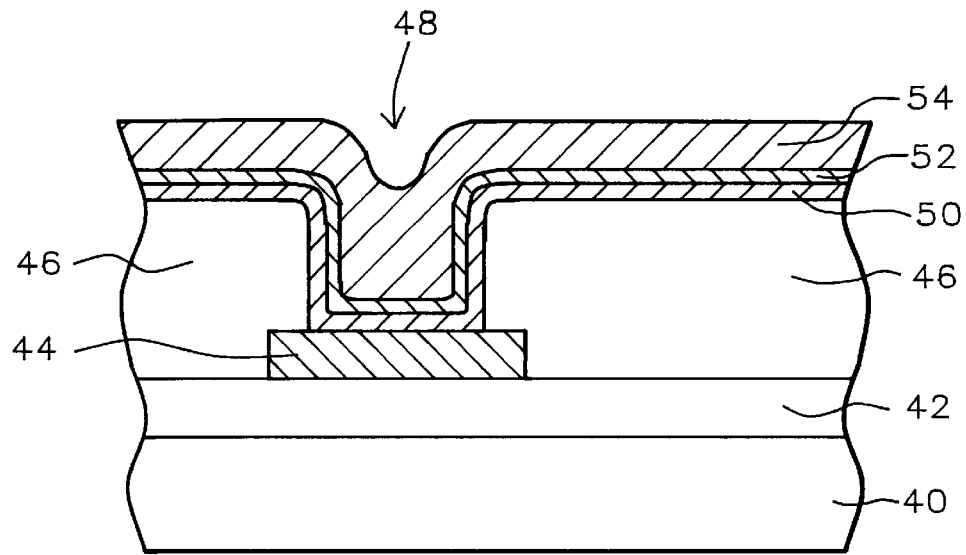

After the nucleation layer 52 has been formed, the pressure within the CVD reactor is increased to between about 60 and 100 Torr, preferably about 90 Torr. The gas mixture is altered to provide a second composition comprising about 700 SCCM or thereabout of $H_2$, 95 SCCM or thereabout of $WF_6$, 300 SCCM or thereabout of $N_2$, and 1,500 SCCM or thereabout of Ar. The temperature of the wafer 40 is maintained between about 375° C. and 475° C. and preferably at about 440° C. A backside pressure of 25 Torr or thereabout is applied to maintain good temperature control and stability. Referring to FIG. 3C, a second layer of tungsten 54 is deposited using this gas composition to a thickness of about 1,200 Angstroms. The thickness of the layer 54 is dependent upon the step coverage requirement of the opening 48.

Figure 3D:
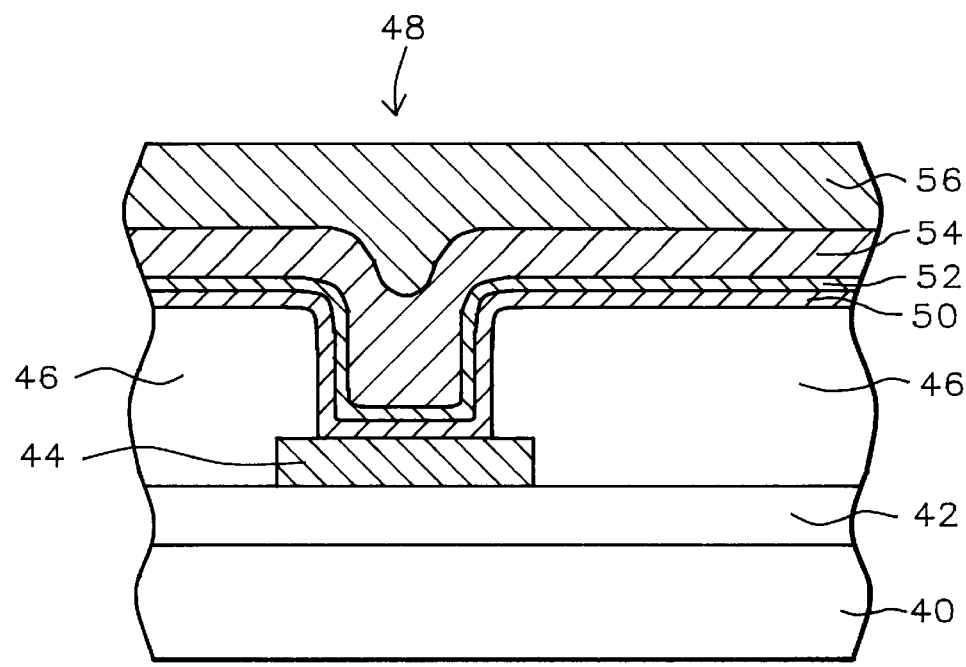

The tungsten interconnect is completed by changing the gas mixture to a third composition comprising about 1,800 SCCM or thereabout of $H_2$, 25 SCCM or thereabout of $WF_6$, 40 SCCM or thereabout of $N_2$, and 2,200 SCCM or thereabout of Ar. The substrate temperature is maintained between about 375° C. and 475° C. and preferably at about 440° C. A backside pressure of 25 Torr or thereabout is applied to maintain good temperature control and stability. Referring to FIG. 3D, a third layer of tungsten 56 is deposited with this gas composition and at a pressure of about 70 Torr, to a thickness of about 2,000 Angstroms. This requires about 80 seconds of deposition time. The layer 56 forms the bulk of the subsequently patterned interconnect stripe and has a low resistivity, low stress, and a high specular reflectivity.

Figure 3E:
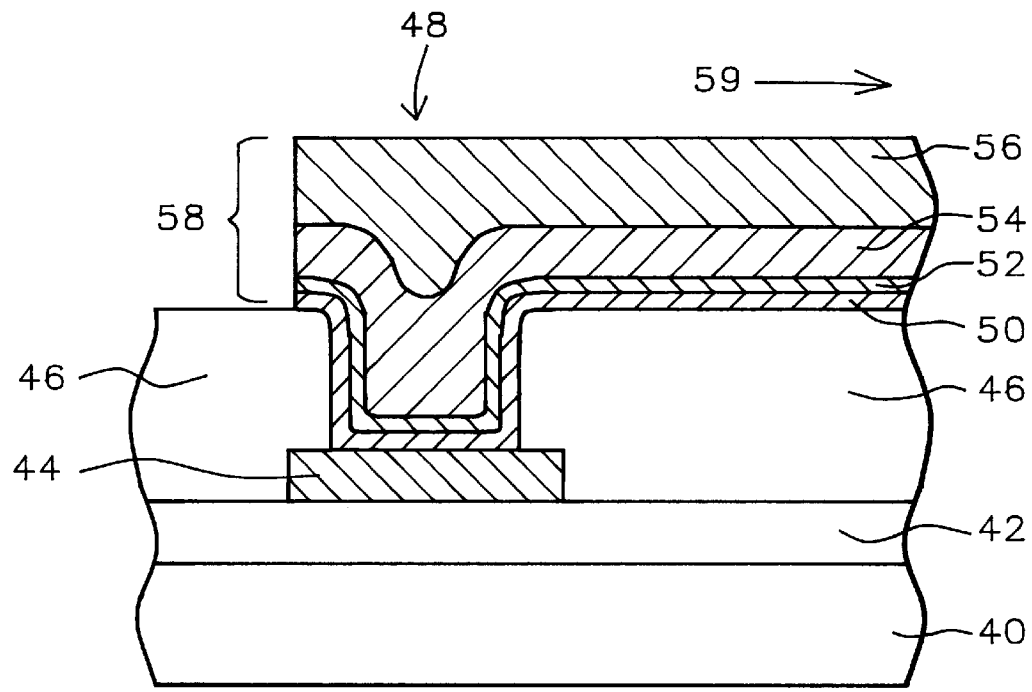

The wafer 40 is removed from the CVD reactor and a photoresist pattern is formed over it using well known photolithographic procedures. The pattern defines an interconnect stripe over the insulating layer 46. Referring to FIG. 3E, the composite conductive layer 58 comprising the tungsten layers 52, 54, 56 and the subjacent adhesion layer 50 is etched, preferably using RIE with a gas mixture containing $SF_6$, forming the interconnect stripe 48. The arrow 59 at the upper right hand side of FIG. 3E indicates that the interconnect stripe 48 proceeds to regions elsewhere on the wafer 40 where additional connections are made.

Figure 4A:
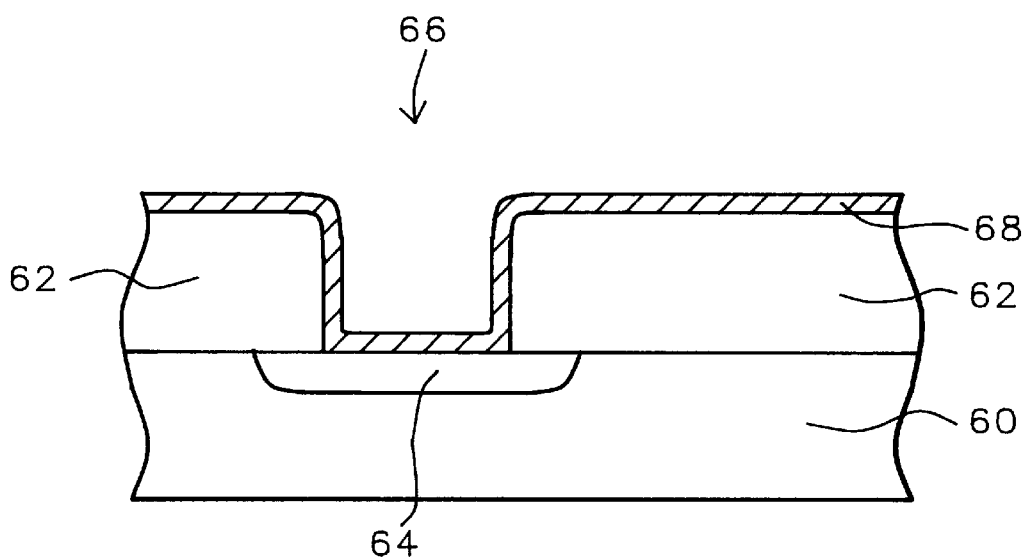
FIG. 4A through FIG. 4D are a cross sections of a portion of an integrated circuit wafer illustrating the process steps of an embodiment of the current invention for the formation of a tungsten plug contact to a subjacent semiconductive device element.

In a third embodiment the a tungsten plug contact is formed utilizing the low stress high edge coverage features taught by the current invention. The method of the third embodiment closely follows that of the first embodiment. However, the third tungsten deposition step is omitted. Instead, after the second tungsten deposition, the composite conductive layer is etched back anisotropically by reactive ion etching whereby conductive material is removed from the planar outer surface while deposited tungsten remains in the openings. The reader is referred to the cross section shown in FIG. 4A. A p-doped <100> oriented monocrystalline silicon wafer 60 is provided. Using standard processing techniques familiar to those in the integrated circuit manufacturing industry, semiconductor devices such as self-aligned polysilicon gate field-effect-transistors(not shown), are formed within the surface of the silicon wafer 60. A heavily doped implant 64 comprises an active area of such a device to which a contact is to be formed.

At the point of insertion of this invention a insulating layer of borophosphosilicate glass(BPSG) 62 between 1.0 and 1.5 microns thick has been deposited over the wafer surface. Typically, the BPSG layer 62 is planarized, either by thermal flowing of the glass or by other well known methods such as chemical mechanical polishing (CMP) or by the use of a spin-on-glass(SOG). and a contact opening 66 has been patterned and etched into it using reactive-ion-etching(RIE). The opening 66 is about 0.5 microns in cross section and has an aspect ratio of about 3. The photoresist mask used to pattern the contact opening 66 is next removed by oxygen plasma ashing and the wafer 60 is given a dip etch in diluted hydrofluoric acid(HF) to remove any native silicon oxide film from the silicon surface exposed by the contact opening 66.

A thin layer 68 comprising Ti followed by TiN is next deposited over the wafer 60 by well known methods, typically by sputtering. This layer 68 comprises the adhesion layer to which the subsequently deposited tungsten interconnect will bond. The detailed functions of this adhesion layer 68 are well known and have been discussed hereinbefore.

The wafer 60 is next placed into the chamber of a CVD reactor wherein the deposition of the tungsten interconnect layer is to be formed by two successive CVD steps. A preferred CVD reactor which is employed in the process of this invention is the Centura WXZ system manufactured by Applied Materials Inc. of Santa Clara, Calif. The chamber is evacuated and the wafer 60 is brought to a temperature of 440° C. or thereabout. The Centura CVD reactor has a wafer support assembly which may be heated during CVD deposition. In addition the surface of the wafer support platform is provided with a channel terminating in an arrangement of grooves on the surface, whereby by a pressure of an inert gas(typically helium which has a high thermally conductivity) may be applied to the underside of the wafer 60. It was found that the application of a backside pressure of 10 mTorr greatly improved the thermal contact between the wafer 60 and the wafer support.

Figure 4B:
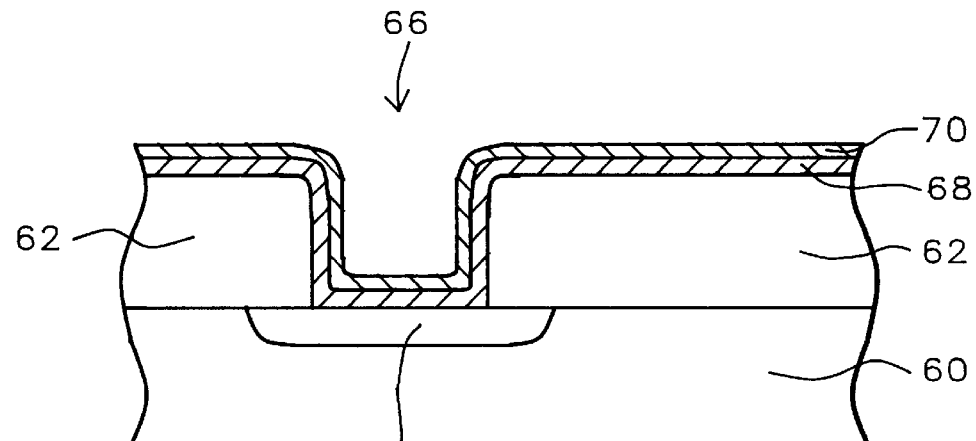

Referring now to FIG. 4B, a tungsten nucleation layer 70 is deposited by admitting a first gas composition comprising 10 SCCM or thereabout of $SiH_4$, 20 SCCM or thereabout of $WF_6$, 300 SCCM or thereabout of $N_2$, and 2,200 SCCM or thereabout of Ar. The preferred ratio of $WF_6$ to $SiH_4$ in the gas mixture is about 2.

The nucleation layer 70, which is about 600 Angstroms thick, may be formed in 44 seconds if a chamber pressure in the reactor of about 4.5 Torr is used. However, at this pressure and below, insufficient backside pressure can be applied in the current apparatus to provide a good thermal contact between the heated substrate holder and the wafer 60. Instead a preferred chamber pressure of about 30 Torr is employed for the deposition of nucleation layer 70 in this embodiment. A backside pressure of about 10 Torr is applied to the underside of the wafer 60. This keeps the temperature of the wafer 60 constant during the deposition. The deposition time is about 30 seconds. The application of backside pressure during the deposition of the nucleation layer has the effect of reducing the stress of a final 3,500 Angstrom thick tungsten layer from about $8.5 \times 10^9 dynes/cm^2$ to about $6.5 \times 10^9 dynes/cm^2$.

Figure 4C:
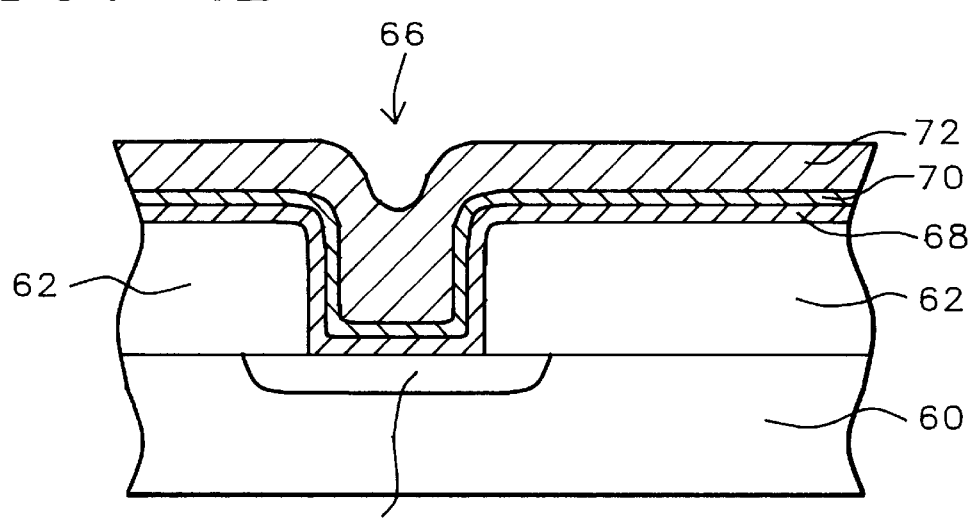
Figure 4D:
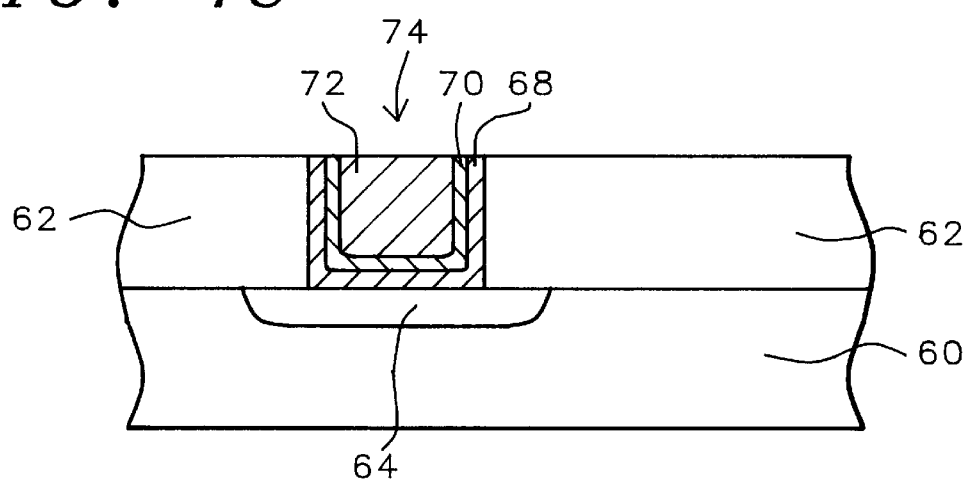

After the nucleation layer 70 is formed, the pressure within the CVD reactor is increased to between about 60 and 100 Torr, preferably about 90 Torr. The gas mixture is altered to provide a second composition comprising 700 SCCM or thereabout of $H_2$, 95 SCCM or thereabout of $WF_6$, 300 SCCM or thereabout of $N_2$, and 1,500 SCCM or thereabout of Ar. The wafer 60 is maintained at a temperature of between about 375° C. and 475° C. and preferably at about 440° C. A backside pressure of 25 Torr or thereabout is applied to maintain good temperature control and stability. Referring to FIG. 4C, a second layer 72 of tungsten is deposited with this gas composition to a thickness slightly greater than half the width of the contact opening 66. The wafer 60 is then removed from the CVD reactor and, referring to FIG. 4D, the tungsten layers 70,72 and the subjacent adhesion layer 68, are anisotropically etched by RIE with a gas mixture containing $SF_6$, forming the tungsten plug 74.

The embodiments of this invention use a p-type silicon substrate. It should be well understood by those skilled in the art that other type substrates may also be used. While the invention has been particularly shown and described with reference to the preferred embodiments thereof, it will be understood by those skilled in the art that various changes in form and details may be made without departing from the spirit and scope of the invention.

While the invention has been particularly shown and described with reference to the use of tungsten, it will be understood by those skilled in the art that various other materials, formed from other precursors, can be used in the same context. These include other refractory metals as well as various forms of polysilicon. Other conductors which lend themselves to CVD deposition such as aluminum and copper may also be included.

What is claimed is:

1. A method of forming a tungsten interconnect with improved step coverage and low stress comprising:

(a) providing a silicon wafer having an insulative layer and an opening in said insulative layer exposing a conductive material;

(b) forming an adhesion layer over said insulative layer;

(c) mounting said silicon wafer onto a heatable substrate holder of a CVD reactor, said substrate holder being equipped with means for applying a backside gas pressure to said silicon wafer, thereby improving thermal contact between said substrate holder and said silicon wafer;

(d) depositing a first tungsten layer by CVD by delivering a reactant gas mixture into said CVD reactor comprising $WF_6$ at between about 10 and 30 SCCM and $SiH_4$ at between about 5 and 15 SCCM, in a carrier gas consisting essentially of $N_2$ and Ar at a flow rate to maintain a chamber pressure of between about 4.5 and 30 Torr, at a deposition temperature of between about 375° C. and 475° C., while applying a backside gas pressure less than said chamber pressure and between about 0 and 10 Torr;

(e) depositing a second tungsten layer by CVD by delivering a reactant gas mixture into said CVD reactor consisting of $WF_6$ at between about 85 and 105 SCCM and $H_2$ at between about 630 and 770 SCCM, in a carrier gas consisting essentially of $N_2$ and Ar at a flow rate to maintain a chamber pressure of between about 60 and 100 Torr, at a deposition temperature between about 375° C. and 475° C., and while applying a backside gas pressure of between about 20 and 30 Torr;

(f) depositing a third tungsten layer by CVD by delivering a reactant gas mixture into said CVD reactor consisting of $WF_6$ at between about 15 and 30 SCCM and $H_2$ at between about 1,500 and 2,000 SCCM, in a carrier gas consisting essentially of $N_2$ and Ar at a flow rate to maintain a chamber pressure of between about 60 and 100 Torr at a deposition temperature between about 375° C. and 475° C., while applying a backside gas pressure of between 25 and about 35 Torr;

(g) depositing and patterning a photoresist layer to define an interconnect; and (h) etching said third tungsten layer, said second tungsten layer, said first tungsten layer, and said adhesion layer, thereby forming said tungsten interconnect.

2. The method of claim 1 wherein the aspect ratio of said opening is between about 2 and 5.

3. The method of claim 1 wherein said adhesion layer comprises TiN.

4. The method of claim 1 wherein said first layer of tungsten is between about 300 and 600 Angstroms thick.

5. The method of claim 1 wherein said second layer of tungsten is deposited to a thickness between about 25% and 40% of the total interconnect thickness.

6. The method of claim 1 wherein said third layer of tungsten is deposited to a thickness between about 60% and 75% of the total interconnect thickness.

7. The method of claim 1 wherein said conductive material is selected from the group consisting of tungsten, tantalum, molybdenum, titanium, aluminum, copper, and silicon.

8. A method of forming a tungsten plug with improved step coverage and low stress comprising:

(a) providing a silicon wafer having an insulative layer and an opening in said insulative layer exposing a conductive material;

(b) forming an adhesion layer over said insulative layer;

(c) mounting said silicon wafer onto a heatable substrate holder of a CVD reactor, said substrate holder being equipped with means for applying a backside gas pressure to said silicon wafer, thereby improving thermal contact between said substrate holder and said silicon wafer;

(d) depositing a first tungsten layer by CVD at a deposition temperature of between about 375° C. and 475° C., while applying a backside gas pressure of between about 0 and 10 Torr, and delivering a reactant gas mixture into said CVD reactor comprising $WF_6$ at between about 10 and 30 SCCM and $SiH_4$ at between about 5 and 15 SCCM, in a carrier gas consisting essentially of $N_2$ and Ar at a flow rate to maintain a chamber pressure of between about 4.5 and 30 Torr;

(e) depositing a second tungsten layer by CVD at a deposition temperature between about 375° C. and 475° C., while applying a backside gas pressure of between about 20 and 30 Torr, and delivering a reactant gas mixture into said CVD reactor consisting of $WF_6$ at between about 85 and 105 SCCM and $H_2$ at between about 630 and 770 SCCM, in a carrier gas consisting essentially of $N_2$ and Ar at a flow rate to maintain a chamber pressure of between about 60 and 100 Torr; and (f) etching said second tungsten layer, said first tungsten layer, and said adhesion layer, by anisotropic etching, thereby forming a tungsten plug.

9. The method of claim 8 wherein the aspect ratio of said opening is between about 2 and 5.

10. The method of claim 8 wherein said adhesion layer comprises TiN.

11. The method of claim 8 wherein said first layer of tungsten is between about 300 and 600 Angstroms thick.

12. The method of claim 8 wherein said anisotropic etching is RIE.

13. The method of claim 1 wherein said backside gas pressure is provided by helium and said means for applying comprises a channel and an arrangement of grooves on the surface of said substrate holder.

14. The method of claim 8 wherein said backside gas pressure is provided by helium and said means for applying comprises a channel and an arrangement of grooves on the surface of said substrate holder.

* * * * *